United States Patent
Dubey et al.

(10) Patent No.: US 6,333,210 B1
(45) Date of Patent: Dec. 25, 2001

(54) PROCESS OF ENSURING DETECT FREE PLACEMENT BY SOLDER COATING ON PACKAGE PADS

(75) Inventors: Ajit M. Dubey, Sunnyvale; Raj N. Master, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/577,675

(22) Filed: May 25, 2000

(51) Int. Cl.[7] .......................... H01L 21/44; H01L 21/48; H01L 21/50
(52) U.S. Cl. .......................... 438/108; 438/612; 438/613
(58) Field of Search .................................. 438/108, 312, 438/613

(56) References Cited

U.S. PATENT DOCUMENTS

| | | | |
|---|---|---|---|
| 4,654,502 | 3/1987 | Furtek | 219/85 |
| 5,258,648 | 11/1993 | Lin | 257/778 |
| 5,647,123 | 7/1997 | Greenwood et al. | 29/840 |
| 5,694,482 * | 12/1997 | Maali et al. | 382/151 |
| 5,697,148 | 12/1997 | Lance, Jr. et al. | 29/840 |
| 5,710,071 | 1/1998 | Beddingfield et al. | 438/108 |
| 5,796,169 * | 8/1998 | Dockerty et al. | 257/780 |
| 5,942,798 | 8/1999 | Chiu | 257/737 |
| 5,988,485 | 11/1999 | Master et al. | 228/180.22 |
| 6,098,867 | 8/2000 | Master et al. | 228/102 |
| 6,103,549 | 8/2000 | Master et al. | 438/106 |

* cited by examiner

*Primary Examiner*—Charles Bowers
*Assistant Examiner*—Nema Berezny (57) ABSTRACT

A method of maintaining z-height of an integrated circuit component, such as a multi-chip module, a chip or a die, and of visualizing alignment of an integrated circuit package during positioning of an integrated circuit component, is disclosed. The method maintains the z-height of an integrated circuit component during a solder reflow step by applying high-melting solder balls to interconnect pads on the package substrate surface. Such high-melting solder balls, for instance 90 Pb/10 Sn, do not collapse at temperatures sufficient to accomplish reflowing. The high-melting solder balls also make convenient visualization marks for alignment of the package substrate on an integrated circuit component placement tool, such as a die placement tool. A package substrate bearing high-melting solder balls in a pre-determined pattern is easily aligned by an integrated circuit placement tool using machine vision. Use of high-melting solder balls as visualization marks obviates the need for screen-printing of fiducial marks on the package substrate surface.

11 Claims, 8 Drawing Sheets

PROCESS OF ENSURING DETECT FREE PLACEMENT BY SOLDER COATING ON PACKAGE PADS

BACKGROUND OF THE INVENTION

1. Field of the Invention

The present invention relates to a process of integrated circuit packaging, and in particular to a method of positioning and affixing an integrated circuit component on a package substrate.

2. Description of the Prior Art

Interconnection and packaging related issues are among the main factors that determine not only the number of circuits that can be integrated on a chip, but also the performance of the chip. These issues have increased in importance as advances in chip design have led to reductions in the sizes of features on transistors and enlargements in chip dimensions. Industry has come to realize that merely having a fast chip will not result in a fast system; it must also be supported by equally fast and reliable packaging.

Essentially, packaging supplies the chip with signals and power, and performs other functions such as heat removal, physical support and protection from the environment. Another important function of the package is simply to redistribute the tightly packed inputs and outputs (I/Os) off the chip to the I/Os of a printed circuit wiring board.

An example of a package-chip system is the "flip-chip" integrated circuit mounted on an area array organic package. Flip-chip mounting entails placing solder bumps on a die or chip, flipping the chip over, aligning the chip with the contact pads on a package substrate, and reflowing the solder balls in a furnace to establish bonding between the chip and the substrate. This method is advantageous in certain applications because the contact pads are distributed over the entire chip surface rather than being confined to the periphery as in wire bonding and most tape-automated bonding (TAB) techniques. As a result, the maximum number of I/O and power/ground terminals available can be increased, and signal and power/ground interconnections can be more efficiently routed on the chips. With flip-chip packaging, proper alignment of the chip and the package is essential to ensure proper operation of the final assembly.

In prior art processes, solder balls, or bumps, are formed on metalized interconnect pads (gold pads) on a surface of an integrated circuit die. Each solder ball corresponds to a conjugate interconnect pad on the surface of a substrate, such as a package board. The integrated circuit die is then positioned on the substrate so that the solder balls lie on top of the substrate interconnect pads. The die and package are then placed together into a reflow oven where they are heated to the melting, or reflow, point of the solder balls. The solder balls melt, forming connections between the die and package interconnect pads.

The general methodology of flip-chip packaging may also be applied to packaging of multi-chip modules. A multi-chip module is essentially a package on which are affixed multiple chips, such as memory chips. In a flip-chip manufacturing process, a multi-chip module is connected to a package substrate, such as a printed circuit board, in a manner similar to that applied to a single die. The challenges and problems associated with multi-chip modules are similar to those encountered with dice.

Hereinafter, integrated circuit chips and dice, multi-chip modules, transistors and other similar integrated circuit devices are referred to in a generic sense as integrated circuit components. This class of components includes solid-state devices generally attached to a printed circuit board in the integrated circuit packaging arts.

It is often desirable when packaging an integrated circuit assembly that there be space between the integrated circuit component, such as a chip, die or multi-chip module, and the package substrate. The resulting space may be left empty, to facilitate heat exchange with the ambient environment, or the space may be filled with an underfill material to add strength to the integrated circuit package assembly, and electrical insulation to the integrated circuit component solder connections. However, providing for space between an integrated circuit component and a package substrate presents problems as discussed below.

Figure 1A:
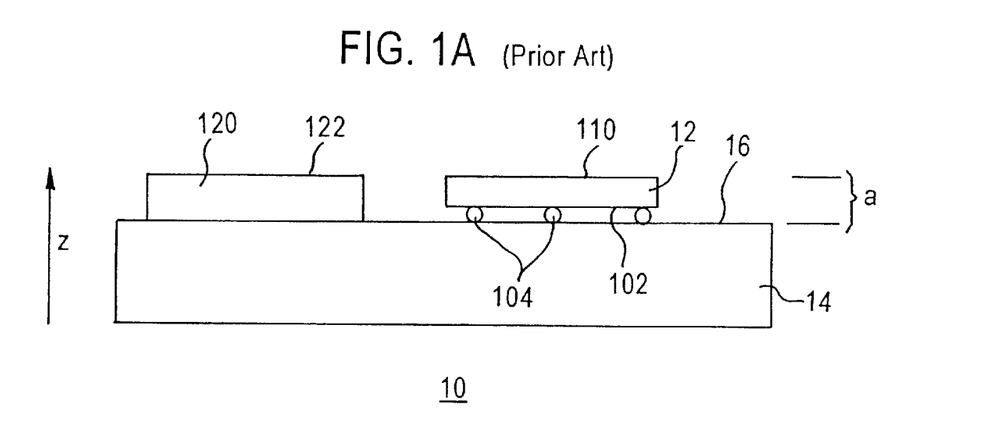
FIG. 1A is a pre-reflow, side elevational view of an integrated circuit package assembly according to a prior art embodiment, which uses low-melting point solder balls.
Figure 1B:
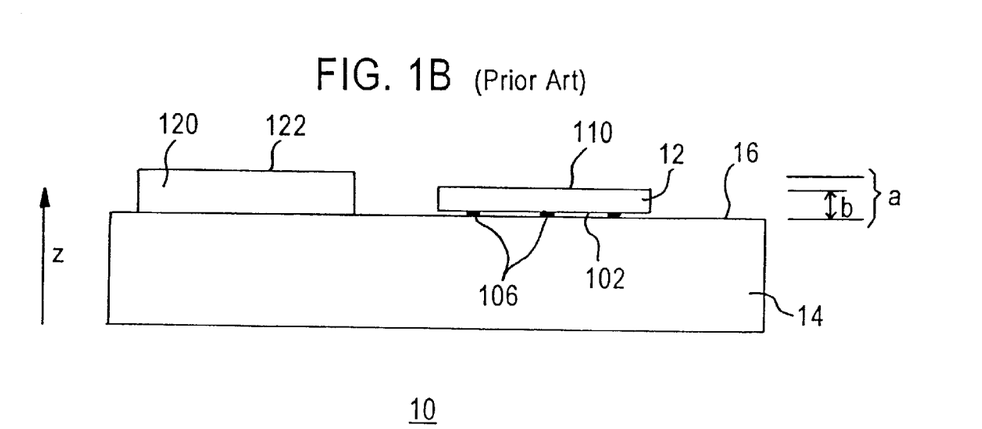
FIG. 1B is a post-reflow, side elevational view of the integrated circuit package assembly according to the prior art embodiment shown in FIG. 1A.

It is known that if solder balls used in prior art processes are made of low-melting, or eutectic, solder, the solder balls will have a tendency to collapse under the weight of a multi-chip module during reflowing. In FIGS. 1A and 1B, side views of an integrated circuit package assembly 10, made by a prior art process, are depicted. FIG. 1A is a side view of an integrated circuit package assembly 10 according to a prior art process, prior to a reflowing step. Multi-chip module 12 has an upper surface 110, a lower surface 102, and a plurality of solder balls 104 disposed on contact pads (not shown) on the lower surface 102 of the multi-chip module 12. The multi-chip module 12 has been positioned on a surface 16 of a substrate 14 so that the solder balls 104 are precisely aligned with cognate substrate interconnect pads (not shown) on the substrate surface 16. A die 120, having an upper surface 122, is also positioned on the surface 16 of substrate 14. The upper surface 122 of die 120 and the upper surface 110 of multi-chip module 12 lie at initial z-height "a" above the substrate surface 16.

In FIG. 1B, the same integrated circuit package assembly 10 is shown after a reflowing step. During the reflowing step, solder balls 104 from FIG. 1A have collapsed to form solder connectors 106 between substrate 14 and multi-chip module 12. The solder connectors 106 assume a pancake-like shape. The upper surface 110 of multi-chip module 12 is now at final z-height b, which is lower than the upper surface 122 of die 120. In other words z-height b is less than z-height a. As mentioned above, this leads to one or more undesirable results. For instance, if it were desirable to underfill multi-chip module 12, it would be impractical to do so given the reduced clearance between substrate surface 16 and module lower surface 102. On the other hand, decreased space between substrate surface 16 and module lower surface 102 results in less efficient heat exchange between ambient air and the multi-chip module 12. Such decreased heat exchange efficiency generally results in higher incidence of thermal breakdown, shorter component life, and poor integrated circuit performance in general. Other problems that arise in similar situations is uneven collapse of solder balls 106, which results in differing lengths of solder balls 106. Where connectors are of different lengths, it can be anticipated that they will have different inductive reactance, different tolerances to mechanical stress, and a greater likelihood to break prematurely. Again, the result is an integrated circuit package that performs more poorly than is desirable.

In an effort to overcome the above-mentioned disadvantages in prior art methods of packaging integrated circuit components, some prior art processes use standoffs to maintain the z-height of integrated circuit components, such as chips, dice and multi-chip modules. Such standoffs are generally conductive pieces, such as metal pieces, which are placed on metalized contact pads, or gold pads, of a multi-chip module to maintain separation between multi-chip modules and the substrates during reflowing. Known standoffs are formed from electrically conductive metal, such as copper, that will not melt and will therefore maintain its shape during reflowing of solder balls.

Figure 2A:
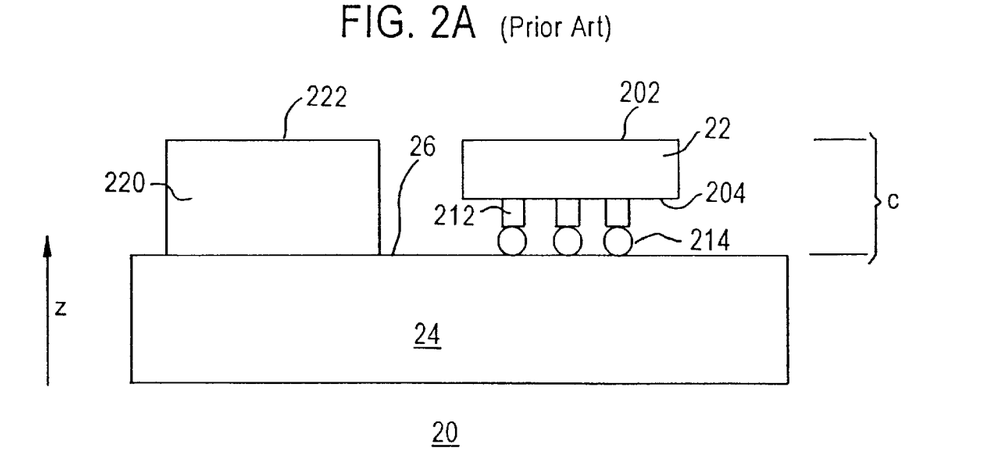
FIG. 2A is a pre-reflow, side elevational view of an integrated circuit package assembly according to a prior art embodiment, which uses copper standoffs and low-melting point solder balls.
Figure 2B:
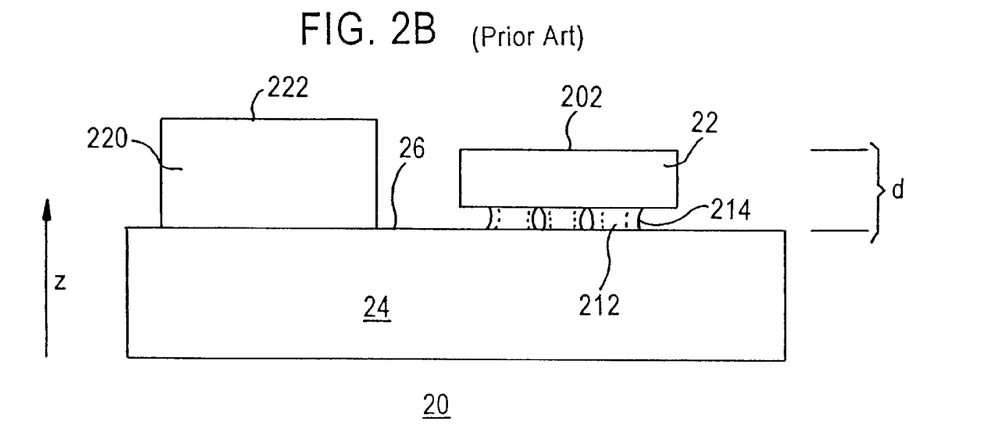
FIG. 2B is a post-reflow, side elevational view of the integrated circuit package assembly according to the prior art embodiment shown in FIG. 2A.

FIGS. 2A and 2B depict a prior art integrated circuit package that uses standoffs. FIG. 2A is a side view of an integrated circuit package assembly 20, prior to a reflowing step. FIG. 2B is the same integrated package assembly 20 after a reflowing step.

In FIG. 2A, a multi-chip module 22 has an upper multi-chip module surface 202, a lower multi-chip module surface 204, and standoffs 212, which are disposed on contact pads (not shown) on the lower multi-chip module surface 204. On the end of each standoff 212 is a solder ball 214. A substrate 24 has a top surface 26, on which are disposed substrate interconnect pads (not shown). The solder balls 214 rest on top of cognate interconnect pads (not shown) on substrate top surface 26. A die 220, having an upper surface 222, is also located on substrate top surface 26. The upper surface 222 of die 220, and the upper surface 202 of multi-chip module 22, lie at an initial z-height c above the top surface 26.

When the integrated circuit package assembly 20 is subjected to reflowing in a reflowing furnace, the solder balls 214 melt and flow up the standoffs 212 by capillary action.

FIG. 2B shows the integrated circuit package assembly 20 after a reflowing step. Hourglass-shaped connectors 230 comprise solder 224 encasing standoffs 212 (dashed lines). The upper surface 202 of multi-chip module 12 is at final z-height d above top surface 26 of substrate 14. The upper surface 202 of multi-chip module 12 is substantially parallel to substrate top surface 26, although final z-height d is lower than z-height d of upper surface 222 of die 220.

Thus, certain prior art manufacturing methods have a disadvantage of requiring formation of metal standoffs on each of the metalized interconnect pads of a multi-chip module. Each standoff must have a solder ball placed on the end thereof. During the manufacturing process, especially in a step of positioning a multi-chip module on a substrate, solder balls are subjected to lateral stresses that tend to break the solder balls off of the standoffs. Moreover, formation of standoffs on each metalized interconnect pad of a multi-chip module is a complex procedure and adds additional steps to the packaging process. Also, care must be taken in choosing solder and standoff metal, because barrier potentials between solder and standoff metal may lead to spurious currents and voltages, and may further result in degradation of the connections through formation of metal oxide layers between the solder and standoff metal.

Prior art processes have a further disadvantage in that z-height of a multi-chip module will change during reflowing. As the solder balls melt, the standoffs sink through the melting solder, sometimes in an uneven fashion. The result is that the z-height of the multi-chip module may vary across its top surface. Additionally, one side of the multi-chip module may heat faster than another, resulting in different rates of melting of solder balls. In such cases, the multi-chip module may become so skewed from its desired conformation that some of the solder contacts may not span the gap between the multi-chip module and the package. All of these considerations add to the costs of manufacturing integrated circuit packages including multi-chip modules.

There is therefore a need in the art for a flip-chip manufacturing process that provides for constant z-height of an upper surface of multi-chip modules and other integrated circuit components, but that does not suffer from the complexities and increased costs associated with prior art processes involving the use of metal standoffs.

Figure 3:
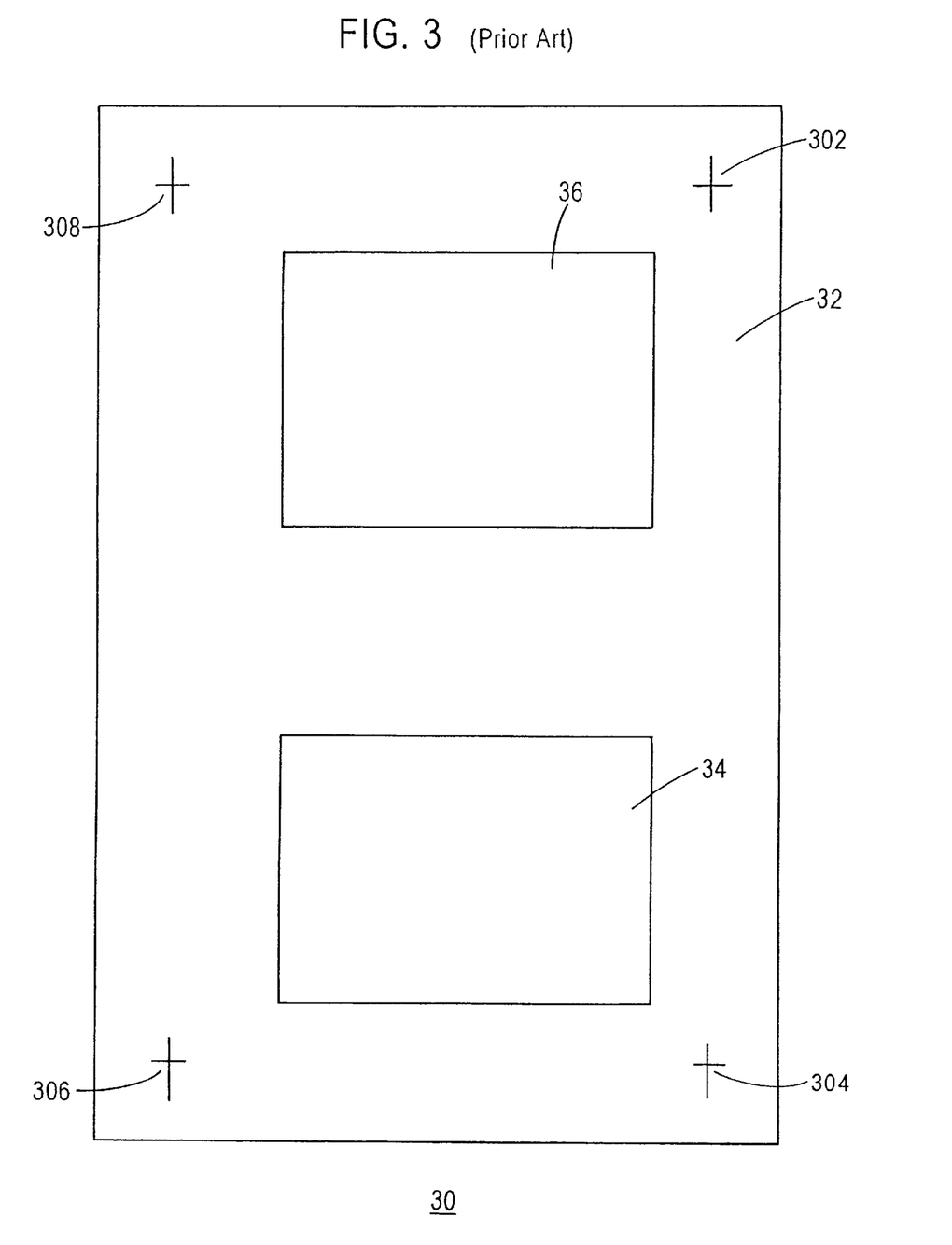
FIG. 3 is a top view of an embodiment of a prior art package board having fiducial marks on the substrate surface.

It is also known in the integrated circuit packaging art to use fiducial marks to check the orientation of a substrate so that components, such as dice and multi-chip modules, are placed in correct positions on package substrates, such as package boards. One such arrangement is shown in FIG. 3, which is a top view showing a substrate 30 having a substrate surface 32. The substrate surface 32 has an imaginary x-y coordinate system, which assists a camera recognition system (not shown) in visualizing the substrate surface 32. The camera recognition system is advantageously part of a Panasonic chip placement tool (not shown) having machine vision. On the substrate surface 32 is a die position 36 and a multi-chip module position 34. A plurality of substrate interconnect pads (not shown) are located on the substrate surface 32 within the die position 36. The position of each substrate interconnect pad corresponds to a die connector pad (not shown) on the surface of a die (not shown). It is imperative that the die be properly placed on the substrate surface 32 so that the substrate connector pads and the die connector pads (not shown) are precisely aligned.

The prior art substrate 30 of FIG. 3 uses four fiducial marks 302, 304, 306 and 308. The fiducial marks 302 are distributed about the surface 32 of package substrate 30 in such a way as to allow a chip placement tool (not shown) to properly position the package substrate 30 using a camera recognition system. Generally, fiducial marks 302, 304, 306 and 308 are distributed roughly symmetrically on the surface 32 of package substrate 30.

In the prior art, substrate 30 of FIG. 1 is positioned on a die placement tool (not shown) such as a Panasonic brand die placement tool with a camera recognition system (machine vision). The placement tool (not shown) uses machine vision to locate the fiducial marks 302, 304, 306 and 308. The die placement tool determines the location of the fiducial marks 302, 304, 306 and 308 using machine vision, and then uses the location of fiducial marks 302, 304, 306 and 308 to determine the orientation of the substrate 30 on the die placement tool. The die placement tool then uses this information as a guide in precisely positioning a die (not shown) on the substrate surface 32.

Prior art processes using fiducial marks (also called detects) as visualization marks for guiding die placement tools require screen printing of fiducial marks on the substrate surface 30. Screen printing is a subprocess that requires masking of the substrate surface 32 with an appropriate resist layer (not shown), applying gold colored marking material to the substrate surface 32, and then removing the resist layer. Fiducials often serve no purpose after bonding of integrated circuit components to package substrates. As they add no value to post-packaged integrated circuit assemblies, it is desirable to develop a process that permits visualization of the substrate surface 32 by an integrated circuit component placement tool without the need for screen printing of fiducial marks. Thus, prior art processes using fiducial marks have the disadvantage of requiring extra steps, manufacturing machinery and material, which in turn increase the cost, manufacturing complexity, error rate and time required for flip-chip manufacturing processes, without adding post-production value to the final product.

There is therefore a need in the art for a process of manufacturing an integrated circuit package assembly that permits a die placement tool to visualize the position of a package substrate, while avoiding, the additional steps of screen printing fiducial marks on substrate surfaces.

SUMMARY OF THE INVENTION

The present invention overcomes the deficiencies of the prior art by providing a unique method of packaging integrated circuits via flip-chip manufacturing methods.

In a process according to the present invention, high-melting solder balls are placed on substrate interconnect pads of a integrated circuit component receiving area of a package substrate. The high-melting solder balls will become molten and perfect contact between substrate interconnect pads and integrated circuit component contact pads in a reflowing oven, but will not collapse under the weight of an integrated circuit component such as a chip, die, or multi-chip module. The high-melting solder balls also act as visualization marks for an integrated circuit component placement tool, such as a Panasonic die placement tool with machine vision, thereby obviating the need for screen printing fiducial marks on the substrate surface. Low-melting, or eutectic solder balls, are placed on cognate contact pads of an integrated circuit component such as a chip, die, or multi-chip module. An integrated circuit component placement tool uses machine vision, for instance a camera recognition system, to visualize the high-melting solder balls on the substrate surface. Thus, the high-melting solder balls combine the functions of both stand-offs and visualization (or fiducial) marks, while avoiding problems and costs associated with both stand-offs and visualization marks.

Some embodiments according to the present invention use high-melting solder balls consisting of lead and tin in a 90:10 proportion, which is also referred to as 90 Pb/10 Sn. However, other high-melting solders may be used to make high-melting solder balls. Suitable high-melting solders have the property that they retain their shape under the weight of an integrated circuit component at reflow temperatures of low-melting point, or eutectic solders.

The high-melting solder balls maintain the z-height of the multi-chip module throughout the placement, reflowing and cooling steps of integrated circuit packaging. Thus, the present invention provides for more consistent solder connection lengths, and therefore more predictable operation and more consistent wear of integrated circuit components than is possible with prior art processes of packaging integrated circuits. In addition, the present invention provides for a process of imaging a package substrate without using detects or fiducial marks. Thus, the present invention obviates the additional steps of screen printing of fiducial marks on the surface of a package substrate. Accordingly, the present invention provides for a process of packaging integrated circuits that is less costly, and more time efficient than prior art processes. Also, the present invention provides for a packaged integrated circuit that is more resilient and dependable than prior art packaged integrated circuits.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

DETAILED DESCRIPTION OF THE INVENTION

The present invention overcomes deficiencies in prior art processes of manufacturing integrated circuits, in particular processes of packaging integrated circuits by flip-chip technology. The present invention provides for a process of packaging integrated circuits, in which high-melting solder balls are placed on interconnect pads of a package substrate, and are subsequently used as visualization marks for an integrated circuit placement machine. The present invention thereby ensures constant z-height of integrated circuit components, such as multi-chip modules, and obviates the complexity and cost associated with screen printing fiducial marks on package substrates. Further advantages of the present invention will become apparent to the skilled artisan upon familiarization with the following description.

Figure 4A:
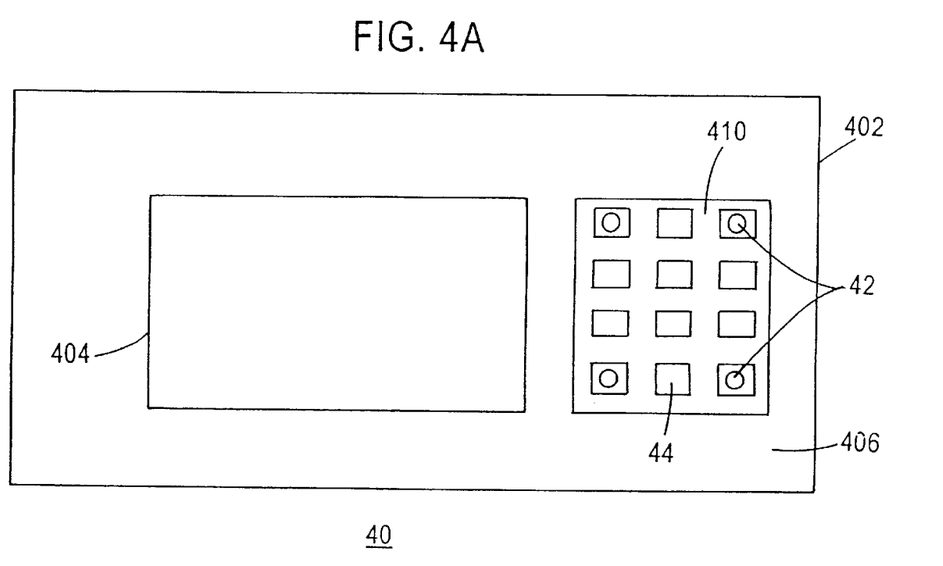
FIG. 4A is a top view of a package substrate according to the present invention.
Figure 4B:
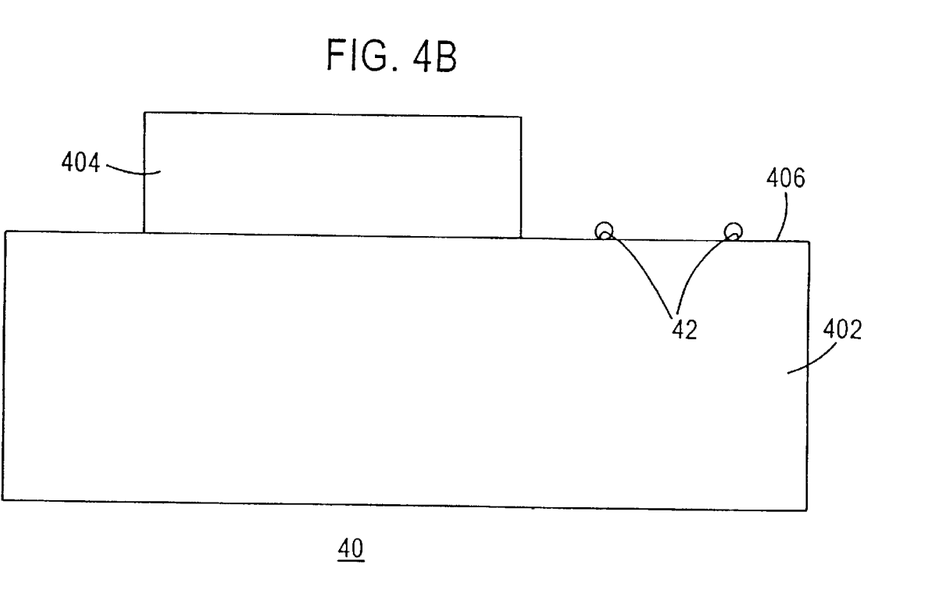
FIG. 4B is a side elevation view of the package substrate shown in FIG. 4A.

FIG. 4A depicts a top view of an exemplary package substrate 40 used in a method according to the present invention. FIG. 4B depicts an elevation side view of the package substrate 40 depicted in FIG. 4A. Package board 402 has a substrate top surface 406. The substrate top surface 406 has a multi-chip module receiving area 410 in which are disposed substrate interconnect pads 44 arranged in a rectangular pattern. In this example high-melting solder balls 42 rest on corner interconnect pads 44, however other configurations are possible as described below. The high-melting solder balls 42 thus form a pattern that may be imaged by an integrated circuit positioning device, such as a Panasonic die placement tool, having a camera recognition system.

In some embodiments according to the present invention, a package substrate may have other components 404 positioned on a surface of the package substrate. Suitable components include dice, capacitors, multi-chip modules, etc.

In some embodiments according to the present invention, interconnect pads and contact pads are gold contacts. In other embodiments, other conductive metals are used. Suitable materials for interconnect pads and contact pads include platinum and silver. Oxidatively inert metals and alloys are particularly suitable.

In some embodiments according to the present invention, the integrated circuit component receiving area on the package substrate includes interconnect pads arranged in a square or rectangular pattern. Such interconnect pads are advantageously arranged in a 5 by 5, 10 by 10, 20 by 20, 15 by 20, etc. grid array. However, other embodiments are included within the scope of the present invention.

Advantageously, high-melting solder balls are placed on the interconnect pads at the corners of the integrated circuit component receiving area. In other embodiments of the invention, however, the high-melting solder balls are located on different interconnect pads. For instance, high-melting solder balls are advantageously located on interconnect pads adjacent the corner pads and along the edge of the integrated circuit component receiving area. For instance, one embodiment has high-melting solder balls on three corner interconnect pads. The resulting pattern is a triangle. Another embodiment has three high-melting solder balls, two on corner interconnect pads along one edge of the integrated circuit component receiving area and one on an interconnect pad located along the opposite edge. This pattern roughly defines a triangle. Other suitable embodiments exist and are contemplated as being within the scope of the present invention.

In general, high-melting solder balls are located on half or less than half of the interconnect pads, and are arranged so that an integrated circuit component placed thereon will be held in place without a reduction in z-height during reflow. Also, high-melting solder balls are arranged in a pattern that is easily discerned by a camera recognition system of an integrated circuit component placement tool, such as a Panasonic die placement tool with machine vision. In addition to rectangular patterns, other suitable patterns for high-melting solder balls include X's, crosses, triangles, and T's. Other patterns are contemplated as being within the scope of the present invention. Suitable embodiments possess high-melting solder balls arranged so that they are easily visualized by an integrated circuit component placement device, such as a Panasonic die placement tool with machine vision, and they also confer the requisite stability to the integrated circuit component during reflow to prevent decrease in z-height of the integrated circuit component.

Some embodiments according to the present invention use high-melting solder balls consisting of lead and tin in a 90:10 proportion, which is also referred to as 90 Pb/10 Sn. However, other high-melting solders may be used to make high-melting solder balls. Suitable high-melting solders have the property that they retain their shape under the weight of an integrated circuit component at reflow temperatures of low-melting point, or eutectic solders.

Figure 5A:
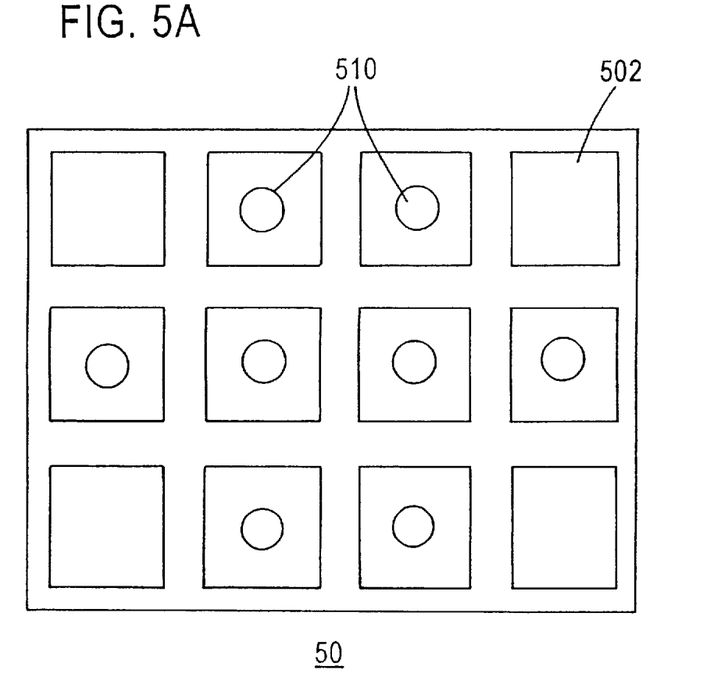
FIG. 5A is a bottom view of a multi-chip module according to the present invention, prior to combination with a package substrate.
Figure 5B:
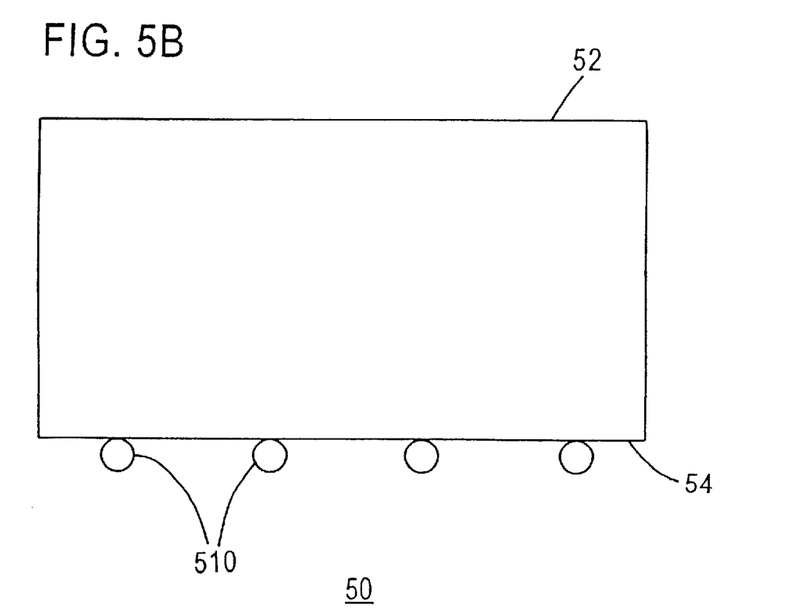
FIG. 5B is a side view of the multi-chip module shown in FIG. 5A.

FIG. 5A depicts a bottom view of an exemplary multi-chip module 50 according to the present invention. FIG. 5B depicts a side elevation view of the multi-chip module 50 of FIG. 5A. The multi-chip module 50 has an upper surface 52 and a lower surface 54. A plurality of module contact pads 502 are disposed on the lower surface 54 of the multi-chip module 50. Eutectic (low-melting) solder balls 510 are disposed on contact pads 502 so that they form a pattern on the lower surface 54 of multi-chip module 50 that is complementary to the pattern formed by the high-melting solder balls 42 resting on corner interconnect pads 442 (FIG. 4A).

Figure 6A:
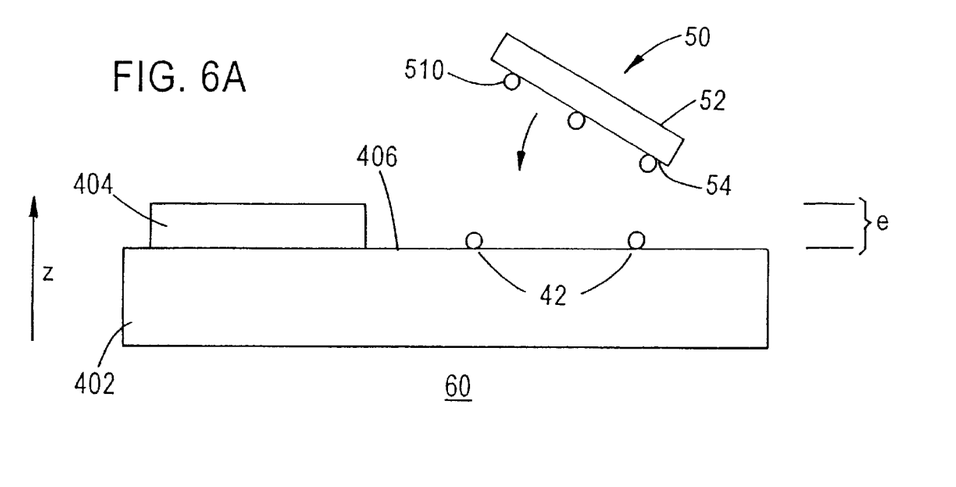
FIG. 6A is a side view of a package substrate and a multi-chip module prior positioning of the multi-chip module, according to the present invention.

FIG. 6A depicts placement of a multi-chip module 50 on the surface 406 of package substrate 402 to form an integrated circuit package assembly 60. Package substrate 402 has disposed on its surface 406 substrate interconnect pads (not shown). High-melting point solder balls 42 are placed on the substrate interconnect pads (not shown) on the top surface 406 of package substrate 402. A multi-chip module 50 is shown apart from the package substrate 402. Tithe multi-chip module 50 has an upper surface 52 and a lower surface 54. Eutectic solder balls 510 are disposed on lower surface 54 of multi-chip module 50 in a pattern complementary to the pattern of high-melting solder balls 42 on top surface 406 of package substrate 402. A target position for multi-chip module 50 on package substrate surface 406 is indicated by dashed (- - -) lines.

Figure 6B:
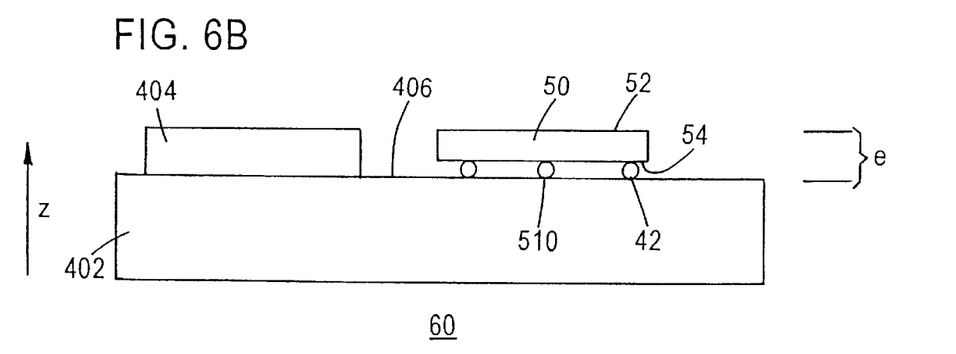
FIG. 6B is a side view of a package substrate and a multi-chip module after positioning of the multi-chip module according to the present invention.

FIG. 6B depicts a side elevation view of an integrated circuit package assembly 60 according to the present invention after multi-chip module 50 has been positioned on top surface 406 of package substrate 402, and before a reflowing step. High-melting solder balls 42 contact multi-chip module contact pads (not shown) on the lower surface 54 of multi-chip module 50. Eutectic solder balls 510 rest on substrate interconnect pads (not shown) on the top surface 406 of package substrate 402. The upper surface 52 of multi-chip module 50 is at z-height e above top surface 406 of package substrate 402.

Figure 6C:
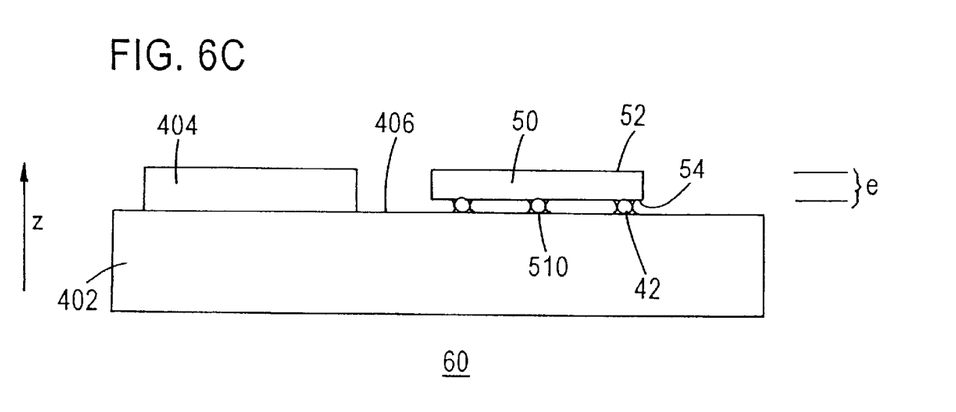
FIG. 6C is a side view of a package substrate and a multi-chip module, as shown in FIG. 6B, after reflowing.

FIG. 6C depicts the integrated circuit package assembly 60 of FIG. 6B after it has been subjected to a reflowing step. High-melting solder balls (42, FIG. 6B) and eutectic solder balls (510, FIG. 6B.) have reflowed to form high-melting solder connections 42 and eutectic solder connections 510, respectively between multi-chip module contact pads (not shown) on the lower surface 54 of multi-chip module 50 and substrate interconnect pads (not shown) on the top surface 406 of package substrate 402. The upper surface 52 of multi-chip module 50 is at z-height e above top surface 406 of package substrate 402.

An advantage of integrated circuit package assembly 60 depicted in FIG. 6C is that there is open space remaining between the lower surface 54 of multi-chip module 50 and the upper surface 406 of substrate 402. Advantageously integrated circuit package assembly 60 may be further subjected to underfilling, in order to increase its structural integrity. Alternatively, the integrated circuit package assembly 60 may be marketed in its current state, the empty space beneath multi-chip module 50 affording greater air flow, and hence improved heat exchange, with the ambient air. Additional advantages include uniform and predictable strength of solder connections, lead lengths and z-height.

Figure 7:
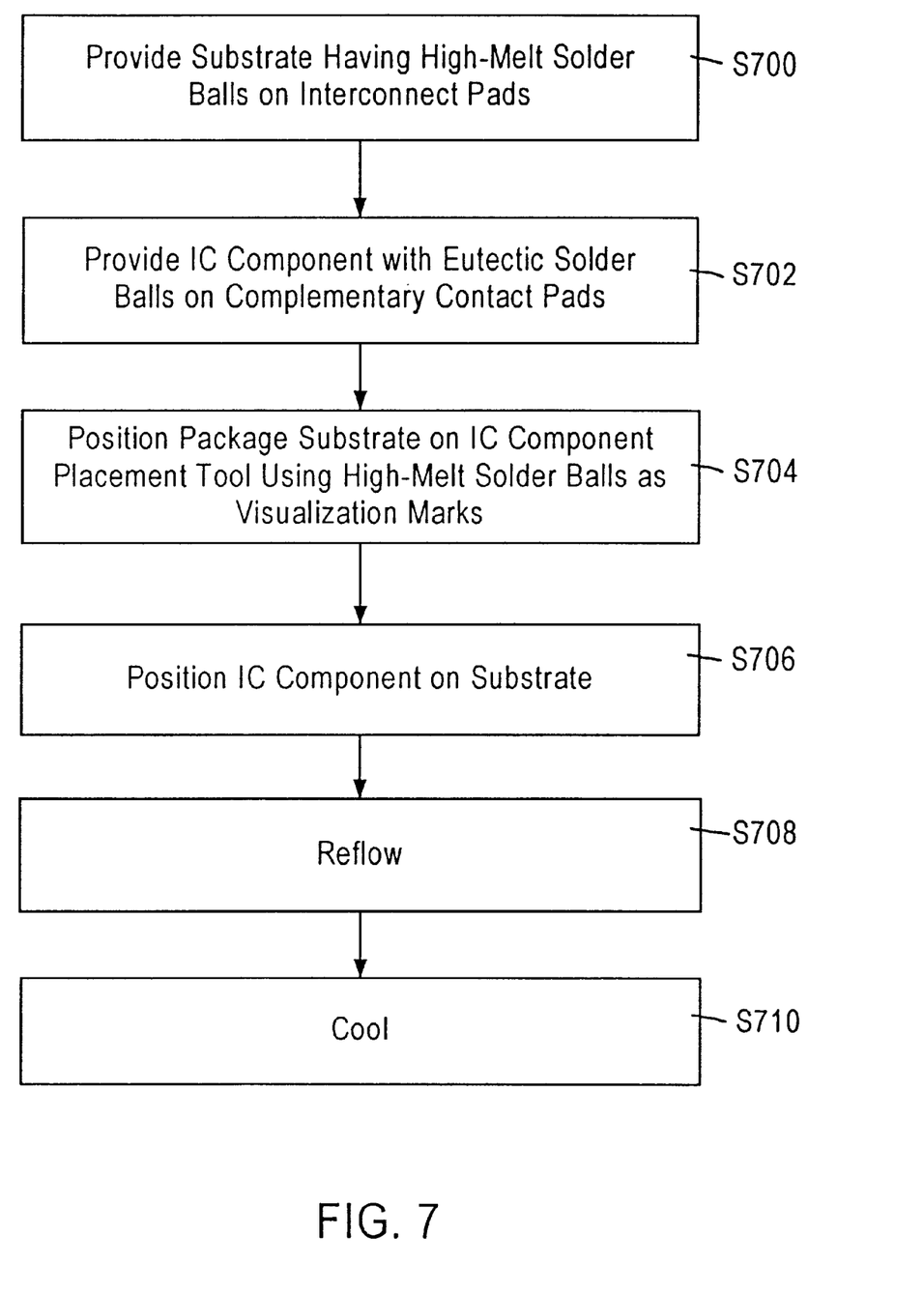
FIG. 7 is a flow chart of a process of packaging an integrated circuit component according to the present invention.

FIG. 7 depicts a flow diagram of a method of manufacturing an integrated circuit package assembly according to the present invention. In S700, a package substrate having high-melting solder balls on substrate interconnect pads is provided. The package substrate may be any package substrate suitable for receiving integrated circuit components such as multi-chip modules, chips, dice, etc. The package substrate has at least one area for receiving an integrated circuit component, which area has a plurality of package substrate interconnect pads. The high-melting solder balls are arranged on the package substrate interconnect pads of the package in a pattern which is capable of being imaged by a camera recognition system of an integrated circuit placement device. In exemplary embodiments of the invention, the high-melting solder balls are located on package substrate interconnect pads in the corners of the integrated circuit component receiving area. The high-melting solder ball pattern is also arranged so that half or more of the package substrate interconnect pads have no high-melting solder balls on them. Exemplary embodiments have high-melting solder balls on three, four or five package substrate interconnect pads. The high-melting solder ball pattern is arranged so that the high-melting solder balls, when heated to a reflow temperature of eutectic solder, will support an integrated circuit component's full weight.

In S702, an integrated circuit component to be combined with the package substrate of S700 is provided. The integrated circuit component has a lower surface on which are disposed integrated circuit contact pads. The integrated circuit contact pads have on them eutectic solder balls disposed in a pattern that is complementary to the pattern of high-melting solder balls on the package substrate provided in S700. Complementary in this context means that each empty integrated circuit contact pad on the lower surface of the integrated circuit component will align with a corresponding high-melting solder ball on the package substrate provided in S700, and each eutectic solder ball belonging to the integrated circuit component provided in S702 aligns with corresponds to a package substrate interconnect pad on the surface of the package substrate provided in S700.

In S704, the package substrate provided in S700 is placed on an integrated circuit component placement tool. Exemplary suitable integrated circuit component placement tools include the Panasonic chip placement tool with machine vision. An integrated circuit component placement tool uses its machine vision to visualize the pattern created by the high-melting solder balls on the package substrate surface, adjusting, if necessary, the orientation and position of the package substrate.

In S706, the integrated circuit component placement tool positions the integrated circuit component provided in S702 on the package substrate positioned in S704. The integrated circuit component placement tool has machine vision, which it uses to visualize the high-melting solder balls on the surface of the package substrate. The integrated circuit component placement tool uses an image of the high-melting solder balls to guide placement of the integrated circuit component provided in S702 on the package substrate positioned in S704. The combination of package substrate and integrated circuit component is an integrated circuit package assembly.

In S708, the integrated circuit package assembly produced in S706 is subjected to reflowing in a reflowing furnace. The eutectic solder balls melt and reflow, while the high-melting solder balls reflow without substantially changing shape. The result is a reflowed integrated package assembly in which the z-height of the integrated circuit component remains constant from placement through reflowing.

Finally, in S710, the integrated circuit package assembly is cooled to provide a finished integrated circuit package assembly wherein the z-height of the integrated circuit component is substantially the same as when it was positioned prior to reflowing and is substantially uniform across the top of the integrated circuit component.

While package substrates of exemplary embodiments according to the present invention that are depicted in FIGS. 4A, 4B and 6A–6E have high-melting solder balls at the corners of multi-chip module placement areas, other embodiments have high-melting solder balls on different interconnect pads. For instance, some embodiments have high-melting solder balls on all the interconnect pads adjacent to the interconnect pads located at the corners of the integrated circuit component placement area. Other embodiments have high-melting solder balls on interconnect pads that are mid-way between corner interconnect pads. Other embodiments include high-melting solder balls on interconnect pads at the center of the IC component receiving area. Package substrate embodiments according to the present invention include those in which a half or more the package interconnect pads do not have high-melting solder balls placed thereon, in which high-melting solder balls form a patter that may be imaged by a camera recognition system of an IC placement device, in which the pattern of high-melting solder ball pattern is complementary to the pattern of eutectic solder balls on the bottom of an integrated circuit component to be placed thereon, and in which the high-melting solder balls together, at a reflow temperature of eutectic solder, will support, without collapsing, the weight of an integrated circuit component such as a multi-chip module or integrated circuit die so that the integrated circuit component's z-height does not substantially change during reflow.

While the exemplary multi-chip module 50 in FIGS. 5A, 5B and 6A–6C according to the present invention has eutectic solder balls on all multi-chip module contact pads except for corner contact pads, other embodiments of the present invention have different patterns of eutectic solder balls. For instance, where the high-melting solder balls are on package substrate interconnect pads that are mid-way between corner interconnect pads, eutectic solder balls on the multi-chip module occupy the corner contact pads and other contact pads complementary to the high-melting solder ball pattern on the package substrate. Suitable examples of integrated circuit components, such as dice and multi-chip modules, of the present invention are integrated circuit components having a pattern of eutectic solder bumps on the contact pads thereof complementary to the pattern of high-melting solder balls on a package substrate according to the present invention.

The present invention thus provides for a process of integrated circuit packaging that requires no detects, such as fiducial marks on the package substrate. The present invention furthermore provides for a process that permits maintenance of integrated circuit component z-height throughout the packaging process, including integrated circuit component positioning. reflowing and cooling. The process requires fewer and less expensive process steps, and is therefore more economical, than prior art processes using fiducial marks and standoffs. The resulting integrated circuit package assembly is also more economical to manufacture, more durable and more reliable than prior art integrated circuit package assemblies that are manufactured by prior art processes.

Some embodiments according to the present invention employ substrates in which the substrate interconnect pads bear high-melting solder balls on corner interconnect pads only. Other embodiments according to the present invention employ substrates in which the high-melting solder balls form different patterns that are detectable by an integrated circuit component placement device having machine vision. Exemplary embodiments according to the present invention are depicted in FIGS. 8A–8D.

Figure 8A:
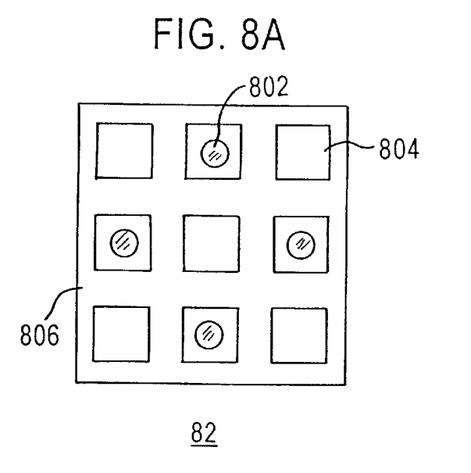
FIGS. 8A–8D are top views of package substrates having high-melting solder balls on substrate interconnect pads in various configurations according to the present invention.

FIG. 8A depicts a substrate 82 having substrate interconnect pads 804 on a substrate surface 806. High-melting solder balls 802 form a +shaped pattern on the substrate interconnect pads 804.

Figure 8B:
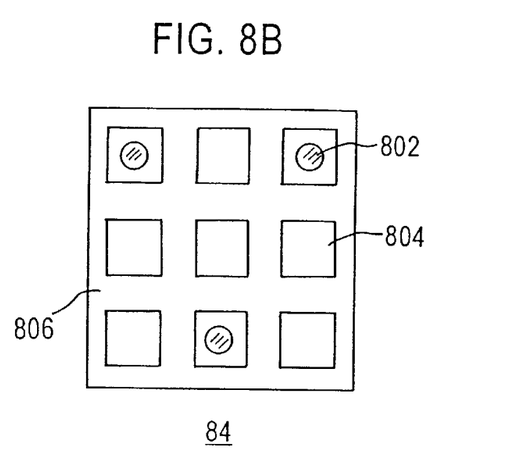

FIG. 8B depicts a substrate 84 having substrate interconnect pads 804 on a substrate surface 806. High-melting solder balls 802 form a r shaped pattern on the substrate interconnect pads 804.

Figure 8C:
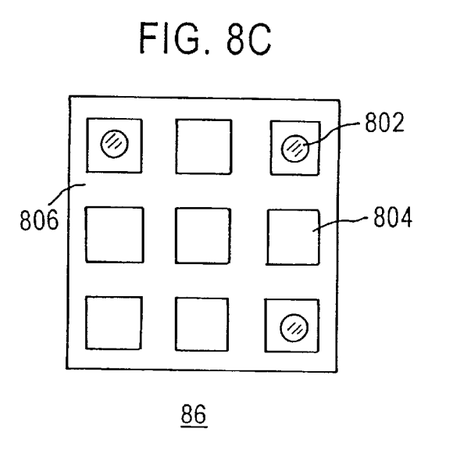

FIG. 8C depicts a substrate 86 having substrate interconnect pads 804 on a substrate surface 806. High-melting solder balls 802 form a Δ shaped pattern on the substrate interconnect pads 804.

Figure 8D:
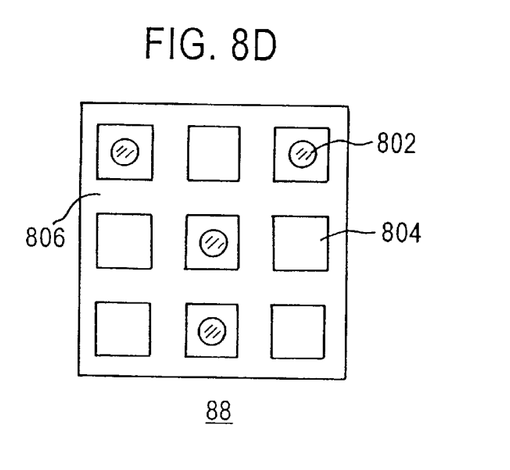

FIG. 8D depicts a substrate 88 having substrate interconnect pads 804 on a substrate surface 806. High-melting solder balls 802 form a Y shaped pattern on the substrate interconnect pads 804.

Other embodiments of substrates having high-melting solder ball patterns of various configurations are also included within the scope of the present invention. Of course the present invention also includes the low-melting solder ball bearing integrated circuit components in which the patterns formed by the low-melting solder balls are complementary to the foregoing high-melting solder ball patterns.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. A process of packaging an integrated circuit component to form a reflowed integrated circuit package assembly comprising:

providing a package substrate having an integrated circuit component receiving area having substrate interconnect pads and high-melting solder balls, said high-melting solder balls being disposed on less than all of the substrate interconnect pads, and said high-melting solder balls forming a pattern detectable by machine vision;

providing an integrated circuit component having component contact pads and eutectic solder balls, said eutectic solder balls being disposed on said component contact pads in a pattern complementary to the high-melting solder balls on the package substrate;

positioning the package substrate on an integrated circuit component placement device having machine vision;

imaging the high-melting solder balls using the machine vision of the integrated circuit component placement device;

positioning the integrated circuit component on the package substrate so that the eutectic solder balls rest on substrate interconnect pads and high-melting solder balls contact component contact pads, thereby forming an integrated circuit package assembly;

heating the integrated circuit package assembly to a temperature sufficient to cause the eutectic and high-melting solder balls to melt and reflow, thereby forming connections between the integrated circuit component and the package substrate; and cooling the integrated circuit package assembly to form a reflowed integrated circuit package assembly.

2. The process of claim 1, wherein the high-melting solder balls consist of 90 Pb/10 Sn.

3. The process of claim 1, wherein the integrated circuit component is a chip or die.

4. The process of claim 1, wherein the integrated circuit component is a multi-chip module.

5. The process of claim 1, wherein the high-melting solder balls form a pattern consisting of one high-melting solder ball on the interconnect pad located at each corner of the integrated circuit receiving area.

6. The process of claim 1, wherein the high-melting solder balls form a pattern comprising one high-melting solder ball on the interconnect pad located at each corner of the integrated circuit receiving area.

7. The process of claim 1, wherein the high-melting solder balls form a pattern consisting of one high-melting solder ball on the interconnect pads located along the outer edge of the integrated circuit receiving area and adjacent each corner of the integrated circuit receiving area.

8. The process of claim 1, wherein the high-melting solder balls form a T-shaped pattern.

9. The process of claim 1, wherein the high-melting solder balls form a triangle-shaped pattern.

10. The process of claim 1, wherein the high-melting solder balls form a pattern consisting of one high-melting solder ball on the interconnect pads located along the outer edge of the integrated circuit receiving area and adjacent each corner of the integrated circuit receiving area.

11. The process of claim 1, wherein the high-melting solder balls, when heated to the reflow temperature of the eutectic solder balls, Support the integrated circuit component without collapsing.

* * * * *